(12) United States Patent
van Schaijk

(10) Patent No.: US 8,853,797 B2
(45) Date of Patent: Oct. 7, 2014

(54) MEMS DEVICES AND FABRICATION THEREOF

(75) Inventor: Robertus T. F. van Schaijk, Eindhoven (NL)

(73) Assignee: NXP, B.V, Eindhoven (NL)

( * ) Notice: Subject to any disclaimer, the term of this patent is extended or adjusted under 35 U.S.C. 154(b) by 250 days.

(21) Appl. No.: 12/990,123

(22) PCT Filed: May 6, 2009

(86) PCT No.: PCT/IB2009/051859
§ 371 (c)(1),
(2), (4) Date: Jan. 21, 2011

(87) PCT Pub. No.: WO2009/138906
PCT Pub. Date: Nov. 19, 2009

(65) Prior Publication Data
US 2011/0260267 A1 Oct. 27, 2011

(30) Foreign Application Priority Data

May 12, 2008 (EP) .................................... 08103929

(51) Int. Cl.
*H01L 27/12* (2006.01)
*B81B 3/00* (2006.01)

(52) U.S. Cl.
CPC ............ *B81B 3/0086* (2013.01); *B81B 3/0078* (2013.01); *B81B 2203/0118* (2013.01); *B81B 2201/016* (2013.01)
USPC ..... 257/414; 257/415; 257/417; 257/E27.001

(58) Field of Classification Search
USPC ................... 361/278; 200/181; 359/224, 291; 257/414, 415, 417, E27.001; 438/52
See application file for complete search history.

(56) References Cited

U.S. PATENT DOCUMENTS

| | | | |
|---|---|---|---|
| 7,071,520 B2 * | 7/2006 | Reid | 257/414 |
| 7,382,515 B2 * | 6/2008 | Chung et al. | 359/290 |
| 2002/0047172 A1 * | 4/2002 | Reid | 257/415 |

(Continued)

FOREIGN PATENT DOCUMENTS

| | | |
|---|---|---|
| EP | 0488576 A1 | 6/1992 |
| GB | 2 436 460 A | 9/2007 |
| WO | 03/081725 A2 | 10/2003 |
| WO | 2004/081263 A1 | 9/2004 |

OTHER PUBLICATIONS

Goosen, J.F.L., et al; "Problems of Sacrificial Etching in the Presence of Aluminium Interconnect"; Sensors and Actuators A 62, Elsevier Science; p. 692-697 (1997).

(Continued)

*Primary Examiner* — Michael Shingleton

(57) ABSTRACT

A MEMS device and method, comprising: a substrate; a beam; and a cavity located therebetween; the beam comprising a first beam layer and a second beam layer, the first beam layer being directly adjacent to the cavity, the second beam layer being directly adjacent to the first beam layer; the first beam layer comprising a metal or a metal alloy containing silicon; and the second beam layer comprising a metal or a metal alloy substantially not containing silicon. Preferably the second beam layer is thicker than the first beam layer e.g. at least five times thicker, and the first beam layer comprises a metal or alloy containing between 1% and 2% of silicon. The second beam layer provides desired mechanical and/or optical properties while the first beam layer prevents spiking.

16 Claims, 4 Drawing Sheets

(56) References Cited

U.S. PATENT DOCUMENTS

| | | | |
|---|---|---|---|
| 2002/0185699 A1* | 12/2002 | Reid | 257/414 |
| 2003/0035197 A1* | 2/2003 | Ikeda et al. | 359/295 |
| 2003/0036215 A1* | 2/2003 | Reid | 438/52 |
| 2004/0051929 A1* | 3/2004 | Sampsell et al. | 359/247 |
| 2004/0100677 A1* | 5/2004 | Huibers et al. | 359/290 |
| 2004/0207497 A1* | 10/2004 | Hsu et al. | 335/10 |
| 2004/0245588 A1* | 12/2004 | Nikkel et al. | 257/415 |
| 2005/0012577 A1 | 1/2005 | Pillans et al. | |
| 2005/0195467 A1* | 9/2005 | Kothari et al. | 359/292 |
| 2005/0249966 A1* | 11/2005 | Tung et al. | 428/622 |
| 2005/0250235 A1* | 11/2005 | Miles et al. | 438/48 |
| 2005/0260784 A1* | 11/2005 | Chen et al. | 438/52 |
| 2008/0055704 A1 | 3/2008 | Neidrich et al. | |
| 2013/0169383 A1* | 7/2013 | Adkisson et al. | 333/186 |

OTHER PUBLICATIONS

Moon, Seungjae, et al; "Thermal Conductivity of Amorphous Silicon Thin Films"; International Journal of Heat and Mass. Transfer 45; Elsevier Science; p. 2439-2447 (2002).

Fritschi, R., et al; "High Tuning Range AlSi RF MEMS Capacitors Fabricated With Sacrificial Amorphous Silicon Surface Micromachining"; Electroelectronic Engineering; Elsevier Publishers, BV., Amsterdam, NL; vol. 73-74; p. 447-451; (Jun. 1, 2004).

International Search Report for Application PCT/IB2009/051859 (Apr. 21, 2010).

* cited by examiner

MEMS DEVICES AND FABRICATION THEREOF

The present invention relates to MEMS devices and fabrication thereof. The present invention is particularly related to MEMS devices with one or more beams fabricated by removal of a sacrificial layer.

Micro Electro Mechanical System (MEMS) devices are known. Many MEMS devices have one or more metal beams positioned over a cavity. The beams are required to provide particular mechanical or optical properties or such like. A commonly used metal for MEMS devices is aluminium alloy.

The cavity under a beam is typically formed by depositing the metal beam material over a sacrificial layer which is later removed. MEMS fabrication processes typically use films and substrates used in semiconductor fabrication because of the advantages of using the manufacturing infrastructure already in place for semi-conductor production. Therefore one typical sacrificial layer material is amorphous silicon (a-Si).

The deposition of metal on silicon can, however, give rise to a problem of silicon absorption into the metal (known as spiking). In particular spiking can occur in MEMS beams during the fabrication process as a result of absorption of silicon from the sacrificial layer into the metal alloy layer.

Quite separate from the field of MEMS devices, it is known to overcome the problem of spiking in semiconductors by adding a small percentage of silicon dissolved in the metal. For aluminium 1-2% Si is sufficient to prevent spiking. This small percentage of silicon controls the amount of silicon or aluminium which is absorbed from one layer into the adjacent layer thus allowing the fabrication of semiconductor devices with the desired semiconductor electrical properties.

The present inventor has realised that applying the same solution to MEMS devices, i.e. adding a small percentage of silicon to the metal alloy, can result in a degeneration of the mechanical and optical properties desired for satisfactory performance of the MEMS device.

The present inventor has further realised that it would be desirable to provide a MEMS beam arrangement and fabrication method which alleviates or removes the degradation in mechanical and optical properties whilst still alleviating or preventing the spiking.

In a first aspect, the present invention provides a MEMS device, comprising: a substrate; a cavity; and a beam; the cavity being located between the substrate and the beam; wherein the beam comprises a first beam layer and a second beam layer, the first beam layer being directly adjacent to the cavity, the second beam layer being directly adjacent to the first beam layer; the first beam layer comprising a metal containing silicon or a metal alloy containing silicon; and the second beam layer comprising a metal substantially not containing silicon or a metal alloy substantially not containing silicon.

The second beam layer may be thicker than the first beam layer.

The second beam layer may be at least five times thicker than the first beam layer.

The first beam layer may have a thickness in the range 100-500 nm.

The second beam layer may have a thickness in the range 500 nm-5 μm.

The first beam layer may comprise a metal or alloy containing between 1% and 2% of silicon.

The second beam layer may comprise one of the alloys selected from aluminium alloy with Cu, Ti or Mn to substantially provide mechanical and/or optical properties of the beam.

In a further aspect, the present invention provides a method of fabricating a MEMS beam, comprising: providing a substrate; depositing a sacrificial layer onto the substrate; depositing a first beam layer onto the sacrificial layer; depositing a second beam layer onto the first beam layer; and removing the sacrificial layer thereby providing a cavity between the substrate and the first beam layer.

The second beam layer may be thicker than the first beam layer.

The second beam layer may be at least five times thicker than the first beam layer.

The first beam layer may have a thickness in the range 100-500 nm.

The second beam layer may have a thickness in the range 500 nm-5 μm.

The first beam layer may comprise a metal or alloy containing between 1% and 2% of silicon.

The second beam layer may comprise one of the alloys selected from aluminium alloy with Cu, Ti or Mn to substantially provide mechanical and/or optical properties of the beam.

The sacrificial layer may comprise amorphous silicon.

In a further aspect, the present invention provides a MEMS device and method, comprising: a substrate; a beam; and a cavity located therebetween; the beam comprising a first beam layer and a second beam layer, the first beam layer being directly adjacent to the cavity, the second beam layer being directly adjacent to the first beam layer; the first beam layer comprising a metal or a metal alloy containing silicon; and the second beam layer comprising a metal or a metal alloy substantially not containing silicon. Preferably the second beam layer is thicker than the first beam layer e.g. at least five times thicker, and the first beam layer comprises a metal or alloy containing between 1% and 2% of silicon. The second beam layer provides desired mechanical and/or optical properties whilst the first beam layer prevents spiking.

The present invention tends to provide or retain desired mechanical and/or optical properties whilst at the same time alleviating or removing spiking.

Embodiments of the present invention will now be described, by way of example, with reference to the accompanying drawings, in which.

Figure 1:
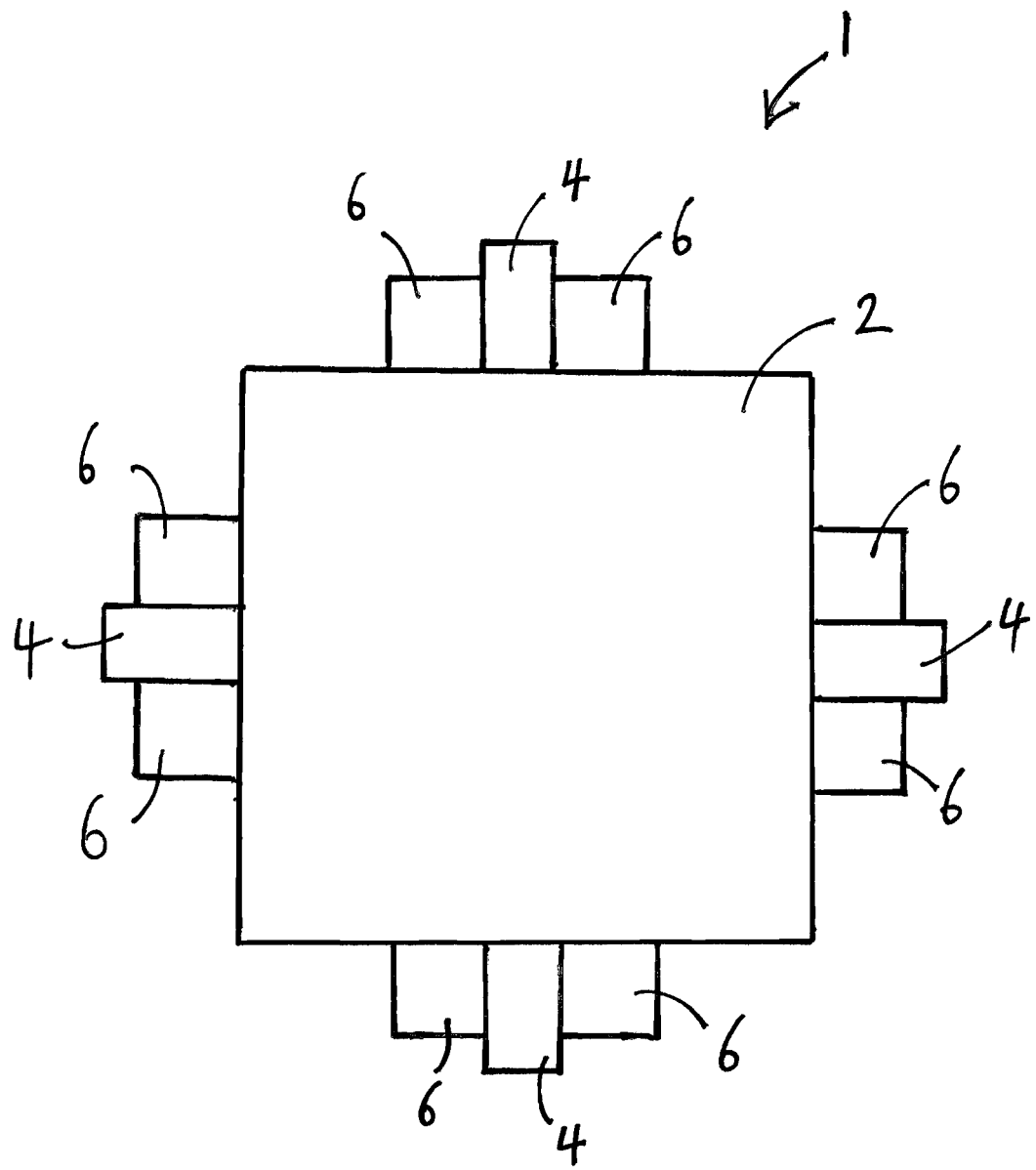
FIG. 1 is a schematic illustration (not to scale) of a MEMS switch.

FIG. 1 is a schematic illustration (not to scale) of a MEMS device which in this embodiment is a MEMS switch 1. The MEMS switch 1 comprises a beam 2 which, in this embodiment, has a four-sided rectangular shape. The MEMS switch 1 further comprises an anchor 4 and two springs 6 provided at each side of the beam 2.

The MEMS switch 1 is a conventional MEMS switch with regard to its construction and operation except for details of the beam 2 and fabrication of the beam 2 as described in detail below.

Figure 2:
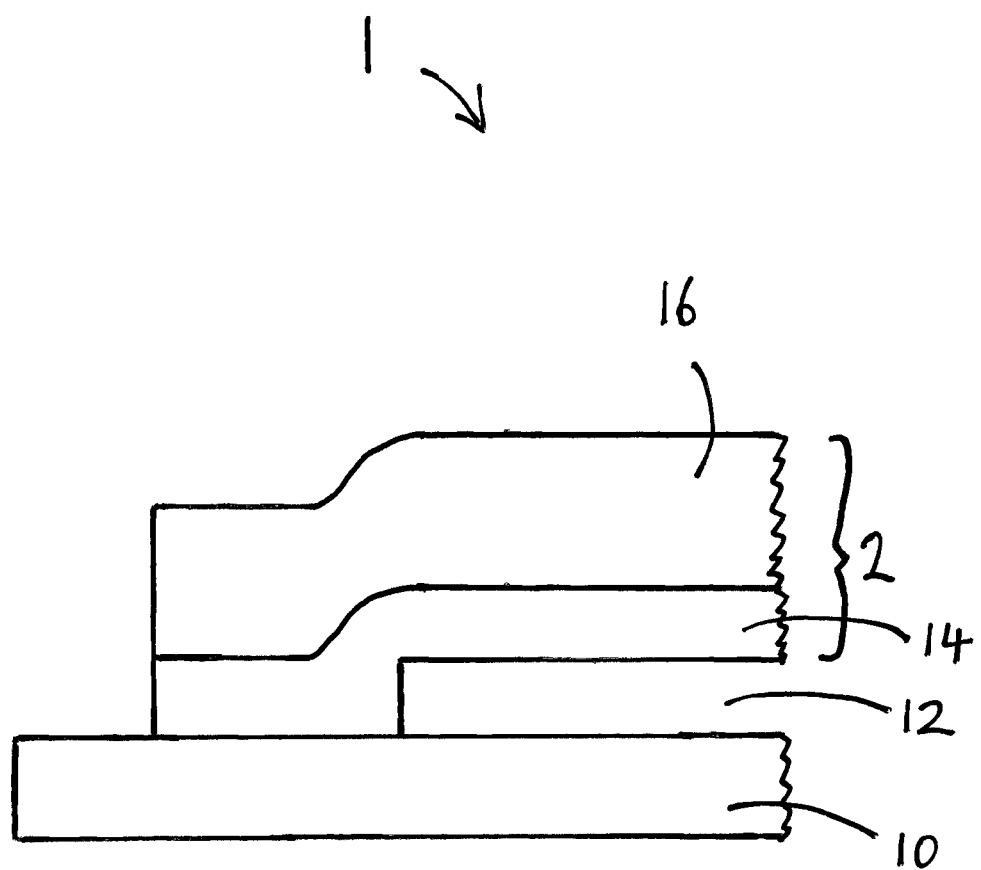
FIG. 2 is a schematic cross section of the MEMS switch of FIG. 1.

FIG. 2 is a schematic cross section of the MEMS switch 1 of FIG. 1 illustrating the structure of part of the MEMS switch 1 in more detail. The same reference numerals are used throughout the figures and the description to denote the same features.

Referring to FIG. 2, the MEMS switch 1 comprises the above mentioned beam 2, a substrate 10 and a cavity 12. The beam 2 overlies the substrate 10. The cavity 12 lies between the beam 2 and the substrate 10.

The beam 2 comprises a first beam layer 14 and a second beam layer 16. The first beam layer 14 is a 100 nm thick layer of aluminium containing 2% silicon. The second beam layer 16 is a 500 nm thick layer of aluminium copper alloy (Cu 1%). The first beam layer 14 is directly adjacent to the cavity 12. The second beam layer 16 is directly adjacent to the first beam layer 14.

Figure 3:
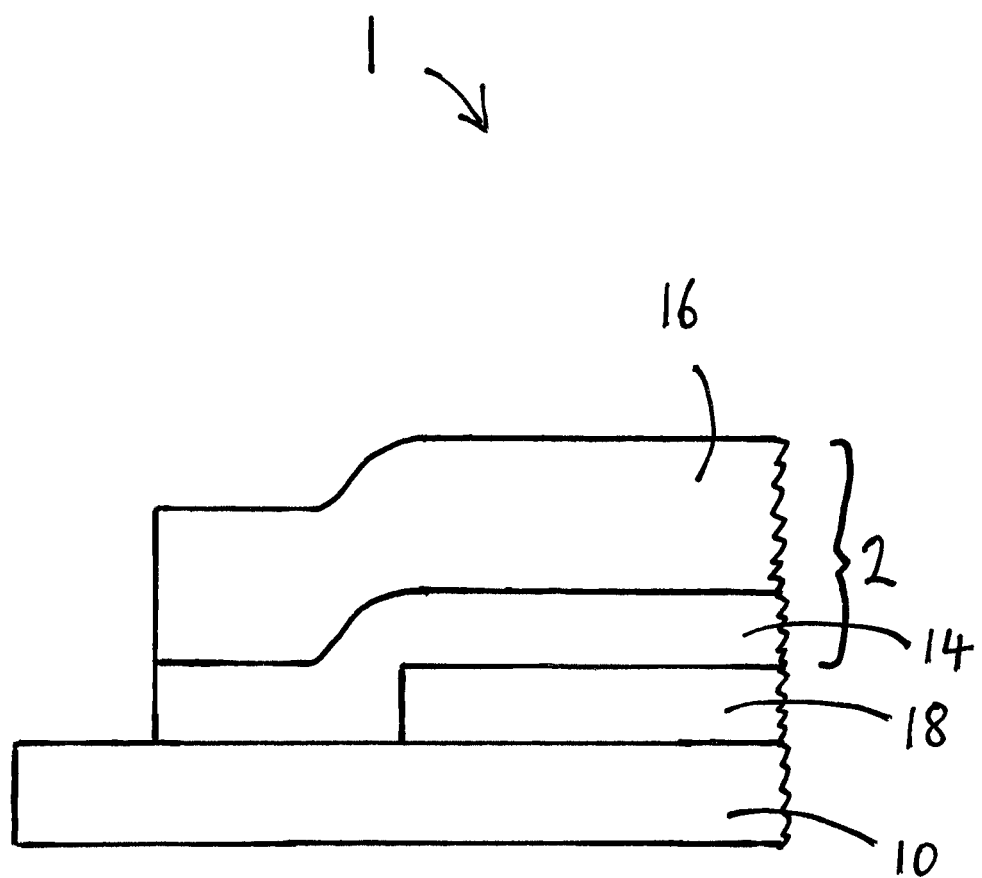
FIG. 3 is a schematic cross section of the MEMS switch of FIGS. 1 and 2 at a fabrication stage.

FIG. 3 is a schematic cross section of the MEMS switch 1 of FIG. 1 at a fabrication stage. At this fabrication stage, the MEMS switch 1 is as shown in FIG. 2 except that it further includes a sacrificial layer 18 located between the substrate 10 and the first beam layer 14, i.e. in the place where the cavity 12 is ultimately provided.

Figure 4:
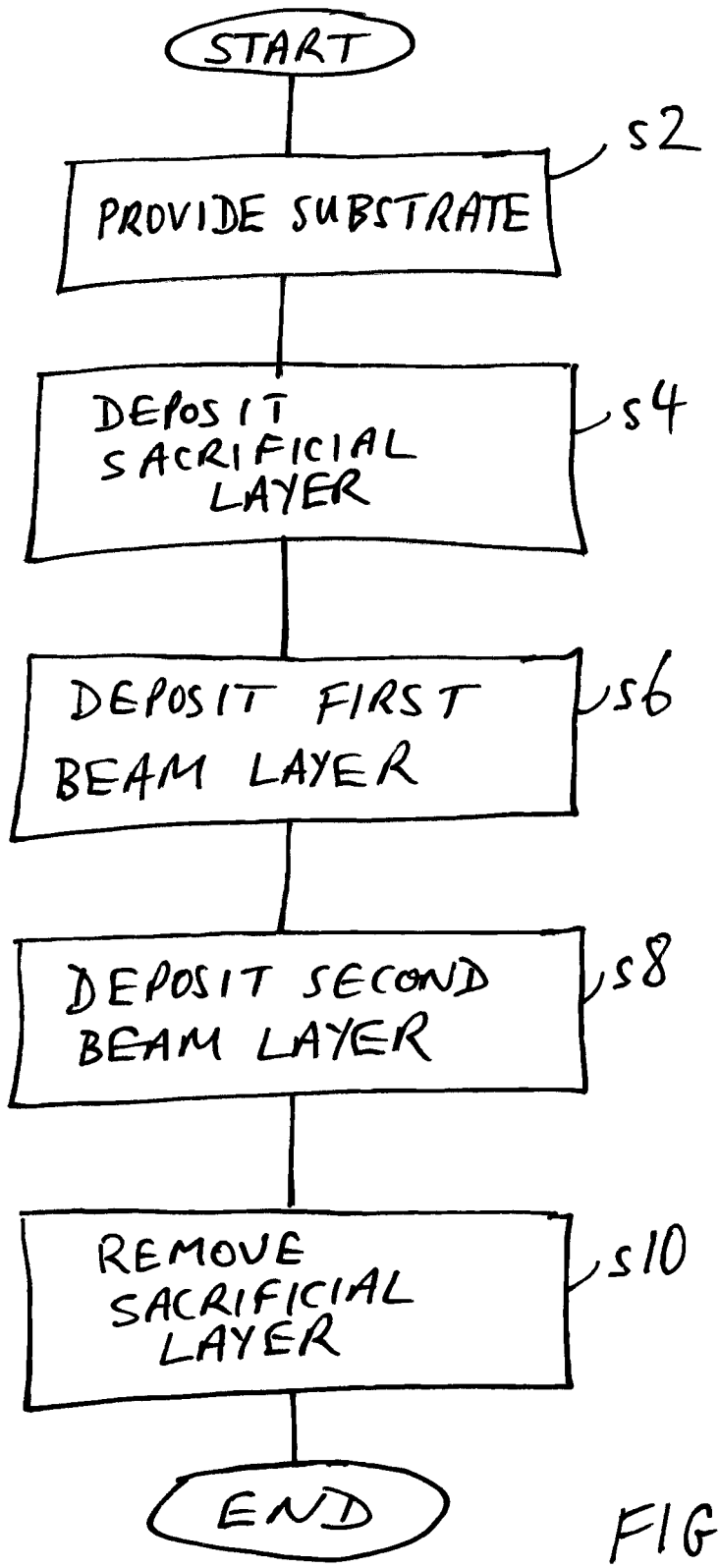
FIG. 4 is a process flow chart showing certain process steps carried out in a fabrication process for fabricating the MEMS switch of FIGS. 1 and 2.

FIG. 4 is a process flow chart showing certain process steps carried out in one embodiment of a fabrication process for fabricating the above described MEMS switch 1.

At step s2, the substrate 10 is provided. The substrate 10 is a conventional MEMS device substrate. The substrate 10 may be of any suitable material compatible with processing steps used in the fabrication of MEMS switches. In this embodiment the substrate is polycrystalline silicon.

At step s4, the sacrificial layer 18 of a-Si is deposited on the substrate 10.

At step s6, the first beam layer 14 is deposited on the sacrificial layer 18 by sputtering. The first beam layer 14 is a 100 nm thick layer of aluminium containing 2% silicon.

At step s8, the second beam layer 16 is deposited on the first beam layer 14 by sputtering of aluminium copper alloy. The second beam layer 16 is a 500 nm thick layer of aluminium copper alloy (Cu 1%).

At step s10, the sacrificial layer 18 is removed by etching. This results in the provision of the cavity 12 and the beam 2. The cavity 12 is provided in the space previously occupied by the sacrificial layer 18. The beam 2 is thereby provided above the cavity 12 and is a single integrated structure made up of the first metal layer 14 and second beam layer 16.

The beam 2 of this embodiment provides the mechanical and/or optical properties required and at the same time avoids spiking. This advantageous effect is particularly emphasised due to the aspect that the second beam layer 16 is significantly thicker than the first beam layer 14, and hence is the main determinant of the mechanical and/or optical properties of the overall beam 2. As such, the second beam layer 16 being at least five times thicker than the first beam layer 14 provides a particularly advantageous trade-off between required mechanical and/or optical properties and desired alleviation of spiking. Nevertheless, at other ratios of thickness, even for example when the second beam layer thickness is the same as the first beam layer thickness, the advantage of the above embodiment is still achieved to at least some extent, due to the mechanical properties being provided as desired by the second beam layer 16 and spiking alleviation properties being provided by the first beam layer 14, even if the mechanical properties of the beam 2 as a whole are not determined substantially entirely by the second beam layer 16.

In the above embodiment the substrate 10 is made of polycrystalline silicon. However, in other embodiments other forms of substrate may be used, for example a glass substrate.

In the above embodiments there are no layers between the substrate and the cavity. However, in other embodiments, other layers may be present between the top surface of the substrate and the cavity. For example, one possibility is that the substrate provided in step s2 of the above described embodiment is itself a composite structure comprising an initial substrate with layers deposited thereon. Another possibility is that after the step of providing the substrate is performed, one or more initial layers may be deposited thereon and/or otherwise processed, prior to performing the step of depositing the sacrificial layer.

In the above embodiments the sacrificial layer is a-Si. However, in other embodiments, other forms of silicon may be used, for example semi-crystalline silicon or polycrystalline silicon. Furthermore, whichever form of silicon is used, the sacrificial layer may be deposited using any appropriate process.

In the above embodiments the sacrificial layer is removed by etching. However, in other embodiments, the sacrificial layer may be removed by any other appropriate process.

In the above embodiments the whole of the sacrificial layer is removed. However, in other embodiments, just a region or regions corresponding to where the beam is to be formed, or other specified region or regions, may be removed.

In the above embodiments, the sacrificial layer is removed after the second beam layer has been deposited on the first beam layer. However, this need not necessarily be the case, and for example in other embodiments the sacrificial layer may be removed after the first beam layer has been deposited but before the second beam layer has been deposited.

In the above embodiments the first beam layer is deposited by sputtering and is a 100 nm thick layer of aluminium containing 2% silicon. However, in other embodiments any one or more of these details may be varied. For example, other thicknesses may be deposited. Thicknesses in the range of 100-500 nm are particularly suitable. In other embodiments metals or alloys other than aluminium may be used, for example an aluminium alloy with Cu, Ti or Mn may be used. Whichever metal or alloy is used, silicon amounts other than 2% may be used, with amounts between 1% and 2% being particularly suitable. In other embodiments, deposition processes other than sputtering may be used.

In the above embodiments the second beam layer is deposited by sputtering and is a 500 nm thick layer of aluminium copper alloy (Cu 1%). However, in other embodiments any one or more of these details may be varied. For example, other thicknesses may be deposited. Thicknesses in the range of 500 nm-5 μm are particularly suitable. In other embodiments metals or alloys other than aluminium copper alloy may be used, for example an aluminium alloy with Ti or Mn may be used. In other embodiments, deposition processes other than sputtering may be used. The material of the second beam layer will typically be selected in accordance with the required mechanical and/or optical properties of the integrated beam structure. Preferably the material and deposition method of the second beam layer are also selected to provide good adherence to the first beam layer.

In the above embodiments the MEMS device is a MEMS switch. In other embodiments other types of MEMS devices may be provided. For example the MEMS device may be a MEMS resonator.

In the above embodiments the integrated beam structure is a rectangular shape. However, in other embodiments other shapes may be used. For example the beam may be circular or oval or it may comprise a single elongated strip of material. Alternatively the beam may be a rectangular shape provided with one or more elongate portions of material. The shape of the beam may be selected in any appropriate fashion in accordance with the desired function of the MEMS device.

It will be appreciated by the skilled person that the terminology "beam" as used above includes any form of relatively thin structure suspended over (or under) a cavity in a MEMS device. As such, in appropriate circumstances this may include MEMS springs.

In summary it will be appreciated that the first beam layer 14 adjacent to the sacrificial layer 18 includes a small percentage of silicon in its metal and hence reduces or overcomes the problem of spiking. The second beam layer 16 provides the beam with the desired mechanical and/or optical properties. Thus the integrated beam structure of the above described embodiments tends to achieve both the desired mechanical and/or optical properties and at the same time reduction or avoidance of spiking.

The invention claimed is:

1. A MEMS device, comprising:
   a silicon substrate;
   a beam; and
   a cavity;
   the cavity being located between the silicon substrate and the beam; wherein
   the beam includes a first beam layer and a second beam layer, the first beam layer being directly adjacent to the cavity, the second beam layer being directly adjacent to the first beam layer;
   the first beam layer includes silicon dissolved in a metal layer and is configured and arranged to use the silicon to mitigate spiking of silicon from an adjacent layer upon contact between the first beam layer and the adjacent layer, wherein the first beam layer is formed by co-depositing silicon and metal simultaneously onto the silicon substrate; and
   the second beam layer includes a metal alloy.

2. A MEMS device according to claim 1, wherein the second beam layer is thicker than the first beam layer.

3. A MEMS device according to claim 1, wherein the second beam layer is at least five times thicker than the first beam layer.

4. A MEMS device according to claim 1, wherein the first beam layer has a thickness in the range 100-500 nm.

5. A MEMS device according to claim 1, wherein the second beam layer has a thickness in the range 500 nm-5 µm.

6. A MEMS device according to claim 1, wherein
   the second beam layer is at least five times thicker than the first beam layer, and
   the first beam layer is configured and arranged to prevent spiking of silicon from the adjacent layer into the second beam layer.

7. A MEMS device according to claim 1, wherein the second beam layer includes one of the alloys selected from aluminium alloy with Cu, Ti or Mn to substantially provide mechanical and optical properties of the beam.

8. A method of fabricating a MEMS beam, comprising:
   providing a silicon substrate;
   depositing a silicon-based sacrificial layer onto the silicon substrate;
   after the silicon-based sacrificial layer is deposited, forming a first beam layer onto the silicon-based sacrificial layer and the silicon substrate by co-depositing silicon and metal simultaneously onto the silicon-based sacrificial layer and the silicon substrate;
   depositing a second beam layer onto the first beam layer; and
   removing the silicon-based sacrificial layer thereby providing a cavity between the silicon substrate and the first beam layer.

9. A method according to claim 8, wherein the second beam layer is thicker than the first beam layer.

10. A method according to claim 8, wherein the second beam layer is at least five times thicker than the first beam layer.

11. A method according to claim 8, wherein the first beam layer has a thickness in the range 100-500 nm.

12. A method according to claim 8, wherein the second beam layer has a thickness in the range 500 nm-5 µm.

13. A method according to claim 8, wherein the second beam layer includes one of the alloys selected from aluminium alloy with Cu, Ti or Mn to provide mechanical or optical properties of the MEMS beam.

14. A method according to claim 8, wherein the silicon-based sacrificial layer comprises amorphous silicon.

15. A MEMS device, comprising:
   a silicon substrate;
   a beam including
      a first beam layer being composed of a metal alloy including dissolved silicon and being formed by co-depositing silicon and metal simultaneously onto the silicon substrate; and
      a second beam layer, being at least five times thicker than the first beam layer and directly adjacent thereto, and configured and arranged to provide optical and mechanical properties of the beam, the first beam layer being configured and arranged to use the silicon to prevent spiking of silicon into the second beam layer from an adjacent material layer, upon contact with the adjacent material layer; and
   a cavity arranged between the silicon substrate and the first beam layer.

16. The MEMS device of claim 15, wherein the first beam layer is 100 nm thick, and the second beam layer is 500 nm thick and includes aluminium copper alloy.

* * * * *